United States Patent [19]

Meola

[11] Patent Number: 5,498,467
[45] Date of Patent: Mar. 12, 1996

[54] PROCESS FOR PREPARING SELECTIVELY CONDUCTIVE MATERIALS BY ELECTROLESS METAL DEPOSITION AND PRODUCT MADE THEREFROM

[75] Inventor: Carmine G. Meola, Elkton, Md.

[73] Assignee: W. L. Gore & Associates, Inc., Newark, Del.

[21] Appl. No.: 281,779

[22] Filed: Jul. 26, 1994

[51] Int. Cl.⁶ .............................. B32B 27/14; B32B 15/00
[52] U.S. Cl. .................... 428/198; 428/256; 428/272; 428/288; 428/311.5; 428/315.5; 428/317.1; 428/422; 428/901
[58] Field of Search ........................... 428/422, 198, 428/288, 315.5, 317.1, 901, 256, 272, 311.5; 427/304, 305, 306

[56] References Cited

U.S. PATENT DOCUMENTS

| | | |
|---|---|---|
| 3,925,578 | 12/1975 | Polichette et al. . |
| 3,953,566 | 4/1976 | Gore ........................ 264/288 |
| 3,969,554 | 7/1976 | Zeblisky . |
| 3,993,802 | 11/1976 | Polichette et al. . |
| 4,199,623 | 4/1980 | Nuzzi et al. . |
| 4,259,113 | 5/1981 | Nuzzi et al. . |
| 4,450,190 | 5/1984 | Nuzzi et al. . |
| 4,511,597 | 4/1985 | Teng et al. . |
| 4,557,957 | 12/1985 | Manniso ........................ 428/422 X |
| 4,594,511 | 6/1986 | Frisch et al. . |
| 4,662,944 | 5/1987 | Nuzzi et al. . |
| 4,701,362 | 10/1987 | Suzuki et al. ........................ 428/422 X |
| 4,747,897 | 5/1988 | Johnson ........................ 156/148 |
| 4,748,056 | 5/1988 | Nuzzi et al. . |
| 4,772,509 | 9/1988 | Komanda et al. ........................ 428/422 X |
| 4,784,901 | 11/1988 | Hatakeyama et al. ........................ 428/422 X |
| 4,916,017 | 4/1990 | Nomi et al. ........................ 428/413 |
| 5,026,591 | 6/1991 | Henn et al. ........................ 428/315.5 X |
| 5,190,813 | 3/1993 | Ohashi et al. ........................ 428/319.7 X |
| 5,227,230 | 7/1993 | McGlade ........................ 428/422 X |

Primary Examiner—George F. Lesmes
Assistant Examiner—Terrel Morris
Attorney, Agent, or Firm—Gary A. Samuels

[57] ABSTRACT

There is provided a process for producing conductive areas through selected portions of the Z axis of a porous planar material. In the process, the planar material is sensitized to the reception of electroless metal with an electroless metal deposition solution. The planar material is provided throughout the selected Z axis areas with a metal salt composition which on exposure to radiant energy, such as light, electron beams, x-ray, and the like, so as to convert the metal cations to metal nuclei. The metal nuclei is then displaced with a more stable metal, such as palladium and then the material is electrolessly plated. The metalized planar material is then imbibed with a resin at such a percentage so that adhesion is provided between two substrates without loss of conductivity in the Z axis.

4 Claims, 2 Drawing Sheets

PROCESS FOR PREPARING SELECTIVELY CONDUCTIVE MATERIALS BY ELECTROLESS METAL DEPOSITION AND PRODUCT MADE THEREFROM

FIELD OF THE INVENTION

This invention relates to an electroless metal deposition process for providing electrical conductivity through the Z axis plane of a porous material at selected portions of the material, while maintaining non-conductivity, i.e., electrical resistivity, at other portions of the Z axis plane and in the X and Y axes.

BACKGROUND OF THE INVENTION

It has been a goal in the electronics industry to replace soldering and welding as a means of providing an electrical connection between two opposing rows or conductive elements. Connection is needed to connect the traces of one flexible circuit to the traces of another flexible circuit; connect a ribbonized flat cable to a printed circuit board; connect a packaged integrated circuit to a printed circuit board; or the like. Moreover, there is a trend to make more efficient use of board space by closely spacing leads or traces, and by generally diminishing component size and circuitry. Usual connectors, e.g., spring, finger or pin contact are not amenable to the diminished sized components that are common today. Two alternative means for providing electrical connection have been proposed to overcome these problems. They are elastomeric connectors and Z-axis adhesives.

Elastomeric connectors employ conductive bands of metal particle filled elastomeric material disposed between bands of non-conductive elastomeric material. These bands form a bar or strip that has alternating conductive and non-conductive regions. The strip is used to make an electrical connection between two parts by placing it between the row of conductive elements on one part and the opposing row of conductive elements on the other part and applying a normal force, usually by means of a clamp. The bands of conductive elastomer make an electrical connection between the conductive elements on one part and the opposing conductive elements on the other part. The width of each conductive elastomer band is less than the spacing between the individual conductive elements on each part, so the conductive bands make an electrical connection between the opposing elements but not between the individual conductive elements on each part. For example, a row of copper lines on one printed circuit board can be electrically connected to a row of copper lines on another printed circuit board without causing an electrical short within the row of copper lines on the printed circuit board themselves.

If the electrical connection between two opposing parts needs to be more permanent, or a constant normal force cannot be exerted, then a Z-axis adhesive is utilized. Z-axis plane adhesives are non-conductive resins filled with conductive particles. They come as either liquids, pastes, or cast films. The Z-axis adhesive is used to mechanically bond and electrically connect the conductive elements on one part and the opposing conductive elements on the other part. The conductive particles are suspended and isolated in the non-conductive resin so as to provide conductivity through the Z axis plane from one side of the connection to the other. The diameter of each conductive particle is substantially less than the spacing of the conductive elements, therefore, there is no shorting between the individual elements. Conversely, the conductive particles have a sufficiently large diameter that they can electrically bridge between the opposing rows of conductive elements to be connected.

Both methods of connection have their limitations. The density of the connection that can be attained by the elastomeric connectors is limited by the spacing of the conductive and non-conductive elements in the elastomeric strip as well as the normal force that must be exerted. The Z-axis adhesive has several limitations based on its ability to keep the conductive particles suspended and isolated in the adhesive. If the particles are not evenly dispersed, they can cause shorting between the conductive elements. If they are not large enough or are not in sufficient concentration, there will not be sufficient conductivity between the conductive elements to be connected. Also, if the adhesive flows or is smeared during processing, the conductive adhesive may cause shorting of other components. Another problem with the Z-axis adhesive is achieving the right balance of adhesion, conductivity, repairability, and compliance.

In some embodiments, a single conductive particle is used to provide the electrical path between two opposing conductive elements. In this type of connector, uniformity of particle size is critical to ensure adequate contact, since the degree to which two opposing conductive elements can be pressed together will depend on the diameter of the larger size particle in the elastomeric connector.

SUMMARY OF THE INVENTION

This invention provides a novel process for preparing a novel electrical connector for connecting one circuit to another, as e.g., two printed circuit boards.

According to the invention, areas of a planar porous member made of a material having pores through it in the Z axis direction are selectively treated in a manner such that a series of conductive paths through the thickness of the Z axis direction from one side of the member to the other are present at certain preselected areas through a vertical cross section of the material defining the pores. In the process of the invention, selected areas through the Z axis direction are made receptive to deposition of a metal salt, which metal salt on exposure to radiant energy is converted to nonconductive metal nuclei which then act to catalyze deposition of a conductive metal from an electroless metal deposition solution.

More particularly, the material defining the pores of a porous member are made receptive to metal deposition by treating it in selected areas with a liquid radiation sensitive composition comprising a solution of a light sensitive reducing agent, a metal salt, a source of halide ions, and a second reducing agent. The porous member is subjected to the radiation sensitive composition for a time sufficient for the composition to permeate or penetrate through the pores of the material and form a coating on the pore interior along the material defining the pores from one side of the porous planar material to the other.

The member is then dried and the surface of one side is then masked with an opaque cover in selected areas so that subsequent radiation will not strike the covered area.

The next step is to expose the treated member to radiation, usually ultraviolet radiation, for a time and at a power sufficient to reduce the metallic cations in the metal salt to metal nuclei throughout the thickness of the member.

The member is then unmasked and then is washed with an acidic or alkaline washing solution to wash off the radiation sensitive composition that had been protected by the opaque cover. The acidic or alkaline washing (or fixing) solution does not affect the areas where the radiation had reduced the metal cations to metal nuclei, if the solution is not left in contact with the areas for more than a few minutes, e.g., 5 minutes or less.

The member is next subjected to a reactive metallic cation replacement solution to replace the metal nuclei and provide a suitable stabilized area to receive a conductive metal. The metal nuclei from the reducing composition is not stable enough to directly deposit conductive metal on because of the tendency of the metal to be oxidized. The metallic cation provides greater stability, and is preferably palladium or gold.

Once the metallic cations are deposited, the member is then plated electrolessly by subjecting it to a solution of a conductive metal salt.

Finally, the member is dried resulting in a member that is selectively conductive throughout the Z axis direction in those selected areas that had not been covered by the masking.

In one embodiment, the member is comprised of alternating bands or strips of conductive areas through the Z axis direction, separated by alternating bands of nonconductive areas, for use as an electrical connector.

In one embodiment also, the planar porous member is stretched microporous polytetrafluoroethylene which has a microstructure of nodes interconnected by fibrils, as described in U.S. Pat. No. 3,953,566. The node/fibril structure defines the pores in the material.

DETAILED DESCRIPTION OF THE INVENTION

According to the invention, there is provided a process for producing conductive areas through selected portions in the Z axis direction of a porous planar member. In the process, the material forming the pores of the planar member is sensitized to the reception of metal with an electroless metal deposition solution in selected areas through the Z axis. The planar member is provided throughout the selected areas with a metal salt composition which on exposure to radiant energy, such as light, electron beams, x-ray, and the like, converts the metal cations to metal nuclei. The metal nuclei is then displaced with a more stable metal, such as palladium and then the member is electrolessly plated.

The planar porous member used herein can be any flexible material having continuous pores from one side to the other. For example, the material can be a woven or nonwoven fabric, such as a nylon, glass fiber or polyester fabric or cotton, or the like. It can also be a porous plastic film or membrane, such as porous polyolefins, or fluoropolymers. A particularly preferred porous material is stretched porous polytetrafluoroethylene having a microstructure of nodes interconnected with fibrils as described further above. In a preferred embodiment, the planar porous material generally will have a thickness of between about 9 and 125 micrometers, but thickness is not a critical factor so long as the ultraviolet strength will penetrate the sample.

Figure 3:
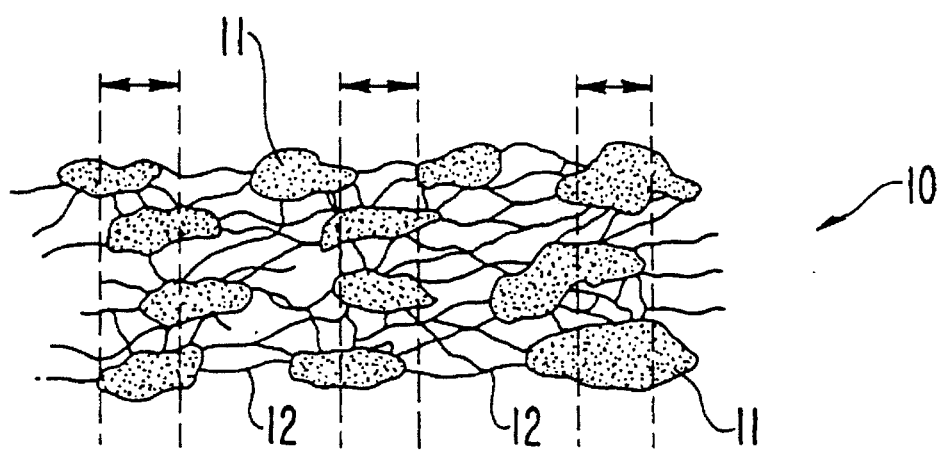
FIG. 3 is a view of planar porous member 10 in which the area of the member through the Z axis that is subjected to UV light is shown as the area between the dotted lines indicated by the double-ended arrows.

The porous planar member must have an internal morphology in which the material defining the pores forms an irregular path through the Z axis direction within a vertically defined cross section through the Z axis plane, as shown in FIG. 3.

Figure 1:
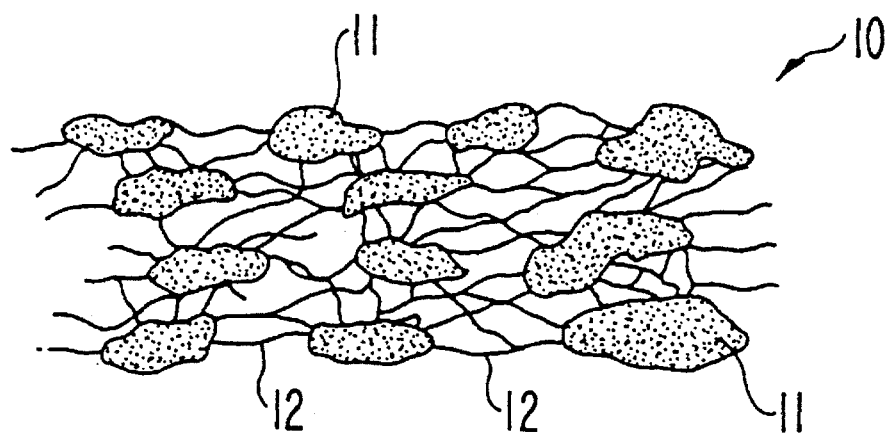
FIG. 1 is a view of a planar porous member 10 in which the material making up the member is a microporous membrane made of nodes 11 interconnected by numerous fibrils 12.

With respect to microporous PTFE, the pores are defined as the space between nodes interconnected with fibrils, as shown in FIG. 1. In this case, the internal structure of nodes interconnected with fibrils is of a material density that results in an irregular continuous path through the Z axis within a vertically defined cross section of the Z axis from one side of the planar member to the other (see FIG. 3).

In the process of the invention, the planar porous member is first wetted with a wetting agent, such as an alcohol, or organic aqueous surfactant. Methanol, propanol, tetrafluoroethylene/vinyl alcohol copolymers or the like may be used. The wetting agent acts to make the material of the member receptive to conductive metals such as nickel or copper. Particularly preferred is copper. The radiation sensitive metal salt composition contains water, the metal salt, e.g. copper acetate or formate, a light sensitive reducing agent, a second reducing agent, and optionally (for hard to wet surfaces) a surfactant. The composition is applied to the material to thoroughly wet the material defining the pores dried and exposed to ultraviolet light radiation to form a non-conductive layer of metallic nuclei. Suitable light-sensitive reducing agents are aromatic diazo compounds, iron salts, e.g., ferrous or ferric oxalate, ferric ammonium sulfate, dichromates e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of 1 mg to 2 grams per liter.

Among the second reducing agents are polyhydroxy alcohols, such as glycerol, ethylene glycol, pentaerythritol, mesoerythritol, 1,3-propanediol, sorbitol, mannitol, propylene gylcol, 1,2-butanediol, pinacol, sucrose, dextrin, and compounds such as triethanolamine, propylene oxide, polyethylene gylcols, lactose, starch, ethylene oxide and gelatin. Compounds which are also useful as secondary reducing agents are aldehydes, such as formaldehyde, benzaldehyde, acetaldehyden, n-butyraldehyde, polyamides, such as nylon, albumin and gelatin; leuco bases of triphenyl methane dyes, such as 4-dimethylamino triphenylmathane, 4',4',4"-tri-dimethylaminotriphenulmethane; leuco bases of xanthene dyes, such as 3,6-bis dimethylamino xanthene and 3,6-bis dimethylanimo-9-(2-carboxyethyl) xanthene; polyethers, such as ethylene gylcol diethyl ether, diethylene glycol, diethyl ether tetraethylene glycol dimethyl ether, and the like.

A second reducing agent that is also a humectant, exemplified by sorbitol, is generally preferred as a constituent of the treating solution, for the humectant, apparently by reason of a moisture conditioning effect on the "dry" coating prior to developing. It provides substantial aid in maintaining density of the metal coating on the internal material of the member during a developing step in which any unconverted radiation-sensitive composition in the coating is washed off of the base.

Among the suitable surfactants are polyethenoxy non-ionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

This treating solution contains an acidifying agent in the form of an acid or acid salt for adjusting the pH of the aqueous solution to usually between about 2.0 and 4.0 (preferably 2.5 to 3.8) and a small quantity of halide ions (iodide, bromide or chloride ions), so that a combination of additives provides a surprising effect in substantially intensifying the density of the coating that is formed subsequently by exposure of the treated planar material to radiant energy. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycerin, etc.) or by some additives for introducing halide ions (e.g., hydrochloric acid). Similarly, some or all of the halide ions may be introduced as components of the reducible metal salt (e.g., cupric chloride).

Among the many suitable acidic substances which may be employed in controlling or adjusting the pH of the sensitizing solution are fluoboric acid, citric acid, lactic acid, phosphoric acid, sulfuric acid, acetic acid, formic acid, boric acid, hydrochloric acid, nitric acid and the like.

A wide variety of bromide, chloride and iodide salt and other halide-generating water soluble compounds may be utilized to provide part or all of the desired halide ion content of the treating solution. These may include, inter alia, salts of metals in general and these halogens as exemplified by cupric bromide, nickel chloride, cobalt chloride, cupric chloride, sodium iodide, potassium iodide, lithium chloride, magnesium iodide, magnesium bromide, sodium bromide, potassium bromide, and the like. Bromide salts are preferred, as they produce a higher degree of sensitivity (i.e., darker and denser deposits) on the substrate than the corresponding chloride in at least certain instances.

The halide ions constitute only a minor proportion of the solute and may typically range from about 0.045 to 1.6% (preferably about 0.13 to 0.45%) based on the total weight of dissolved solids. The amount of halogen may be stated otherwise as between about 0.9 and 25 milliequivalents of halogen per liter of the sensitizing solution, preferably about 2.5 to 9 milliequivalents, e.g., 0.3–1.0 g./l. for cupric bromide. Increasing the proportions of the halide ions is usually undesirable as such increases appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least 2:1 and preferably about 4:1 to 100:1.

The treated member is then dried by air drying or oven baking at below 50° C. At this stage, to preserve the light-sensitive nature of the treating compositions, the material should be processed under yellow light conditions. The member should also be kept at a temperature less than 70° F. and at no greater than 60% relative humidity because of possible absorption of water by the material of the member which can adversely affect the process.

Figure 2:
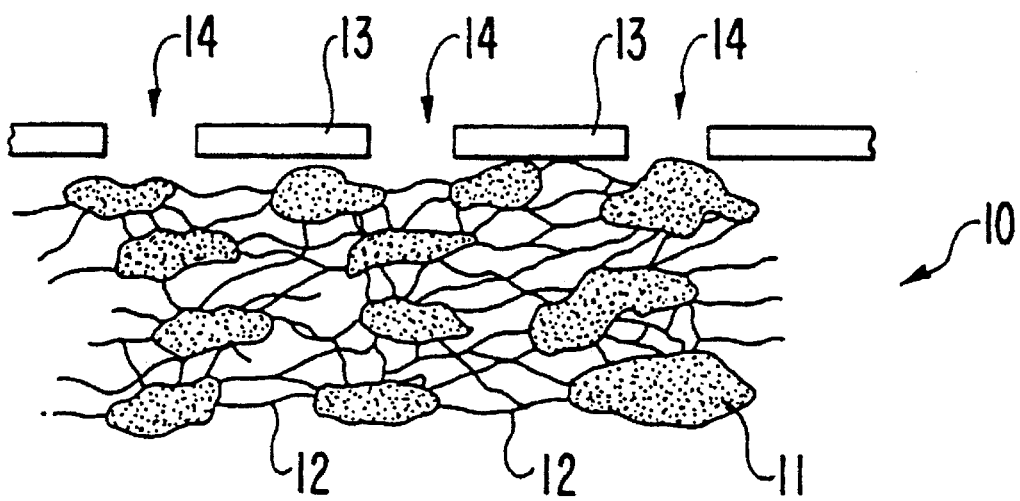
FIG. 2 is a view of planar porous member 10 with opaque masking covers 13 in place along the top surface of member 10 and spaced apart so that UV light is transmitted to and through member 10 only at the areas marked with arrows 14.

The treated member is then selectively masked with a metallic mask, diazo or silver halide film, as shown in FIG. 2. The masked member is then photo imaged with either a non-collimated or collimated ultraviolet light source of less than 400 manometers wavelength. The catalyst itself requires a minimum of 200 millijoules radiant energy to establish a stable photo image.

The UV light energy is strong enough to penetrate through the thickness of the porous member. Thus, in subsequent plating operations, the conductive metal plates continuously through the Z axis and provides electrical continuity in the Z axis. If desired, the UV light energy can be applied to both sides of the planar member.

After a 5 minute normalization period, the catalyzed material is then washed for a short period of 30–90 seconds in a sulfuric acid solution, e.g. a solution consisting of 8% sulfuric acid by weight and 92% deionized water by weight or an alkaline solution consisting of 40 g/l of ethylene diamine tetra-acetic acid, 100 ml/l of formaldehyde, adjusted at a pH of greater than 10 with sodim hydroxide. The purpose of this washing step is to eliminate the unexposed catalyst from the material while retaining the photoreduced image.

The washed material containing the selective image is next stabilized with a reactive metal cation replacement solution. A convenient solution is a solution consisting of:

0.25 gram/liter of palladium chloride

8% sulfuric acid by weight

92% D.I. water by weight

The image undergoes a replacement reaction of the copper with more stable cation, e.g., palladium. A more stable system is desired because of tendency of the copper to oxidize at such thin layer amounts and because of the ability of the palladium to initiate the reduction reaction in the electroless both more rapidly. The member is kept in this solution at least 30 seconds, and is subsequently washed in D.I. water for about 1 minute.

The catalyzed member is now selectively electrolessly plated with one or more conductive metals to a deposition thickness of about 50–60 micro inches. During the time in the electrolyses baths, the member is agitated with a rocking motion to promote diffusion of the metal to the innermost region of the substrate. Plating is carried out by first rinsing in deionized water, then dipping in an agitated electroless copper bath for a time sufficient to deposit copper in the material over the palladium and through the substrate thickness. Thus, within selected areas through the material in the Z axis direction, the material is coated with a conductive metal so as to form a continuous path of conductivity through the selected areas.

The Z axis conductive member finds usefulness as a connector interface between computer chips, chip packages, multi-chip modules, flex circuits, molded housings, connectors and printed circuit boards.

The passageways of the material can be filled with an adhesive if the material is to be used as a connector interface between two other conductive materials. Suitable adhesives include epoxy resin, acrylic resin, urethane resin, silicone resin, polyimide resin, cyanate ester resin, or the like. The adhesive is conveniently imbibed into the pores by immersing the member in a solution of the adhesive. For an epoxy resin, a suitable solvent is methylethylketone.

Figure 4:
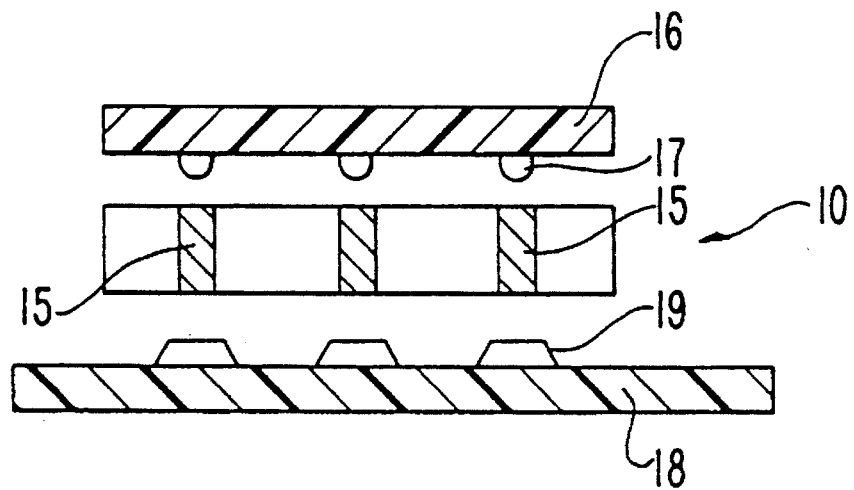
FIG. 4 is an exploded view of member 10 of the invention with the areas plated with conductive metal through the Z axis plane shown as 15; the member being between chip 16 and PCB 18.

Referring to FIG. 4, the member of the invention is shown as 10. The plated areas are shown as 15. A computer chip 16 is shown with conductive bumps 17. On the other side of member 10 is shown a printed circuit board 18 with conductive pads 19 on the surface. The plated areas 15 are shown in alignment with the bumps 17 and pads 19, and provide a conductive path between the bumps and pads.

EXAMPLES

In the following examples, the catalytic treating solution used was prepared by adding to one liter of D.I. water:

A 30 grams, 2,6 or 2,7 di-sodium anthraquinone di-sulfonic salt
B 220 grams of sorbitol
C 15 grams of cupric acetate
D 0.5 grams of cupric bromide
E 2 grams of olin G-10 surfactant
F adjust to pH of 3.5 to 3.8 with fluoroboric acid The fixing solution used was 8% sulfuric acid by weight, 92% distilled water by weight.

The stabilizing solution used was 0.25 g/l palladium chloride

8% sulfuric acid by weight

92% distilled water by weight

Example 1

A stretched porous polytetrafluoroethylene membrane obtained from W. L. Gore & Associates was treated with a wetting agent by immersing it in a solution of 75% methanol, 25% ethanol and of 1 weight % copolymer of tetrafluoroethylene and vinyl alcohol at room temperature for about 30 seconds.

The wetted membrane was then dipped into the catalytic treating solution for 60 seconds and was then dried in an oven at 50° C. for 3 minutes. One surface of the membrane was then masked with dots of a diazo film of 6 mil diameters and 6 mil separation center to center.

The membrane was then exposed to a collimated UV light source at 1600 millijoule for about 2 minutes.

After a 5 minute normalization period, the UV treated membrane was then washed for 30 seconds in the fixing solution to eliminate unexposed catalytic treating solution.

The selectively imaged membrane was then stabilized by dipping into the stabilizing solution for one minute and then washing in distilled water for one minute.

The stabilized membrane was then dipped into a copper plating bath composition (Shipleys 3350) of on a per liter of D.I. water basis, 30 grams of ethelyenediamine tetra acetic acid 6 to 8 grams sodium hydroxide 5 to 7 grams copper II sulfate 2 to 3 grams formaldehyde 2 grams of a given surfactant The membrane was agitated in the bath using an agitation bar for 7½ minutes to promote diffusion of copper throughout the pores of the membrane in the catalyzed portion throughout in the Z axis.

It was then impregnated with epoxy adhesive in order to provide bonding capability and baked at 160° C.

To test the electrical properties, 3 inch square pieces of the membrane were then placed between two pieces of 1 oz 2×2 inch copper sheets. The area of the copper is smaller than the area of the membrane to prevent the copper from touching together during the lamination cycle. The composition piece was then laminated at 50 psi at 375° F., at a ramp of 10 degrees per minute on a platen press, for a period of 1 hour. After the sample was cooled, it was tested on an Hewlett Packard (HP) 3478A multimeter in the following fashion:

A. A test fixture which consists of a swivel arm, that contains a 1 square cm copper contact surface, and a stationary bottom platform, which also has a 1 square cm copper surface were cleaned with 2-propanol.

B. The swivel arm was then loaded with a 6 lb weight, intended to simulate a 40 psi load when the contact surface of the swivel arm comes to rest on top of the stationary contact.

C. The top and bottom contacts are connected to the HP3478A multimeter to measure resistance as a 4 point wire test.

D. With the fixture closed (Top and Bottom contacts touching), and no sample, the meter is zeroed.

E. The sample is then rested on the bottom portion of the fixture, while the top swivel arm is open.

F. The top swivel arm then closes onto the sample and contact resistance is measured (as ohms). This measures the Z direction conductivity.

The surface resistance is measured as follows:

1. A sample is placed onto a nonconductive surface.

2. A four point probe is connected to a HP3478A multimeter, and zeroed on a nonconductive surface.

3. The probe is then placed on the sample, where the measurements are taken as ohms/sq cm.

The sample of Example 1 had electrical resistance in the Z axis of 0.0008 ohm and was nonconductive in the X and Y planes.

Example 2

A 6 mil (150 micrometer) thick stretched, porous, polytetrafluoroethylene membrane was wetted by subjecting it to 2 propanol by dipping for 1 minute.

It was then dipped into the catalytic treating solution for one minute and then dried as in Example 1. It was then masked as in Example 1 and subjected to UV light as in Example 1.

It was then subjected to the fixing and to the stabilizing solution as in Example 1. It was then plated with copper as in Example 1 and coated with copper as in Example 1, and coated with the epoxy adhesive as in Example 1.

The membrane was tested as in Example 1. It had electrical resistance in the Z axis of 0.0017 ohm and was nonconductive in the X and Y planes.

Example 3

A 2 mil thick stretched porous polytetrafluoroethylene membrane was prepared as in Example 1 except that the masking strips were 3 mil pad with a 10 mil pitch.

On testing as in Example 1, the membrane had electrical resistivity in the Z direction of 0.0011 ohms and was nonconductive in the X and Y planes.

Example 4

A three mil thick Kevlar porous paper was treated as in Example 2 except a ion collimated light source was used and the masking strips were 30 mil pads.

On testing, as in Example 1, the electrical resistance in the Z axis was less than 50 mill ohms and the X and Y axis were nonconductive.

I claim:

1. An electrically conductive member comprising a planar flexible material having an X, Y and Z axis and having a number of irregularly shaped pores extending through the material in the Z axis, said material having a series of adjacent vertically defined cross-section areas extending from one side to the other through the Z axis width of the material, each area being defined so that the material defining the pores within said area extends from said one side to the other, said material within alternating vertically defined cross-section areas being covered with conductive metal, and said material in adjacent cross-section areas not being so covered, so that said adjacent areas are not conducive; and wherein the planer flexible material is selected from the class consisting of stretched porous polytetrafluoroethylene having a microstructure of nodes interconnected by fibrils, which define the pores, and polyester fabric.

2. The member of claim 1 in which the material is said polyester fabric in the form of a woven or nonwoven fabric.

3. The member of claim 1 wherein the metal is copper.

4. The member of claim 1 where the pores are filled with an adhesive.

* * * * *